US012782812B2

(12) United States Patent
Takeda et al.

(10) Patent No.: US 12,782,812 B2
(45) Date of Patent: Nov. 3, 2026

(54) PHOTOSENSITIVE RESIN COMPOSITION, PHOTOSENSITIVE ELEMENT, METHOD FOR FORMING RESIST PATTERN, AND METHOD FOR PRODUCING PRINTED WIRING BOARD

(71) Applicant: Resonac Corporation, Tokyo (JP)

(72) Inventors: Akiko Takeda, Tokyo (JP); Tetsuya Kato, Tokyo (JP)

(73) Assignee: RESONAC CORPORATION, Tokyo (JP)

(*) Notice: Subject to any disclaimer, the term of this patent is extended or adjusted under 35 U.S.C. 154(b) by 758 days.

(21) Appl. No.: 18/019,201

(22) PCT Filed: Apr. 27, 2021

(86) PCT No.: PCT/JP2021/016811
§ 371 (c)(1),
(2) Date: Feb. 1, 2023

(87) PCT Pub. No.: WO2022/030052
PCT Pub. Date: Feb. 10, 2022

(65) Prior Publication Data
US 2023/0288802 A1 Sep. 14, 2023

(30) Foreign Application Priority Data
Aug. 7, 2020 (JP) ................................. 2020-134942

(51) Int. Cl.
*G03F 7/033* (2006.01)
*G03F 7/09* (2006.01)
*G03F 7/20* (2006.01)
*G03F 7/40* (2006.01)
*H05K 3/00* (2006.01)

(52) U.S. Cl.
CPC .............. *G03F 7/033* (2013.01); *G03F 7/091* (2013.01); *G03F 7/2004* (2013.01); *G03F 7/40* (2013.01); *H05K 3/00* (2013.01)

(58) Field of Classification Search
None
See application file for complete search history.

(56) References Cited

U.S. PATENT DOCUMENTS 8,728,716 B2 * 5/2014 Andou ...................... G03F 7/40 430/315
2009/0054543 A1 * 2/2009 Nozawa .................. G03F 7/027 560/104
2011/0086309 A1 * 4/2011 Nankawa .......... C08F 220/1806 430/315
2016/0330845 A1 * 11/2016 Okade ................... G03F 7/2053
2019/0062480 A1 * 2/2019 Yokoyama ............ C08F 220/46
2023/0273518 A1 * 8/2023 Kato ..................... G03F 7/0295 430/287.1

FOREIGN PATENT DOCUMENTS

| | | | | | |
|---|---|---|---|---|---|
| CN | 107077068 | A | | 8/2017 | |
| JP | H7-140650 | A | | 6/1995 | |
| JP | H07159998 | A | * | 6/1995 | |
| JP | 2002-196490 | A | | 7/2002 | |
| JP | 2007272138 | A | * | 10/2007 | |
| JP | 2010014937 | A | * | 1/2010 | |
| JP | 2012208453 | A | * | 10/2012 | ............... G03F 7/40 |
| JP | 2013015666 | A | * | 1/2013 | |
| JP | 2013051410 | A | * | 3/2013 | |
| JP | 5174124 | B2 | * | 4/2013 | |
| JP | 2013-195712 | A | | 9/2013 | |
| JP | 2016-143064 | A | | 8/2016 | |
| JP | 2017129663 | A | * | 7/2017 | |
| JP | 2018169548 | A | * | 11/2018 | |
| JP | 2018-204011 | A | | 12/2018 | |
| JP | 2019049648 | A | * | 3/2019 | |
| JP | 2020204757 | A | * | 12/2020 | |
| KR | 20130051402 | A | * | 5/2013 | ........... G03F 7/0758 |
| KR | 20150011311 | A | * | 1/2015 | ............. G03F 7/004 |
| TW | 201426184 | A | * | 7/2014 | ............. G03F 7/004 |
| TW | 201627758 | A | | 8/2016 | |
| TW | 201629628 | A | | 8/2016 | |
| TW | 202040272 | A | | 11/2020 | |
| WO | 2010/001691 | A1 | | 1/2010 | |
| WO | 2016/104585 | A1 | | 6/2016 | |
| WO | WO-2019026546 | A1 | * | 2/2019 | ............... G03F 7/40 |
| WO | 2019/181698 | A1 | | 9/2019 | |

OTHER PUBLICATIONS

Machine translation of JP 2018-169548 (no date) (Year: 0000).*
Machine translation of JP 20070272138 (no date) (Year: 0000).*

* cited by examiner

*Primary Examiner* — Amanda C. Walke
(74) *Attorney, Agent, or Firm* — FITCH, EVEN, TABIN & FLANNERY, LLP

(57) ABSTRACT

A photosensitive resin composition according to an embodiment of the present disclosure contains: a binder polymer including a structural unit derived from a (meth)acrylate compound having a dicyclopentanyl group; a photopolymerizable compound; a photopolymerization initiator; a sensitizer having an absorption at 340 to 430 nm; and an ultraviolet absorber, in which a molar absorption coefficient of the ultraviolet absorber for light at a wavelength of 365 nm is in a range of 500 to 50000 L/(mol·cm).

18 Claims, No Drawings

PHOTOSENSITIVE RESIN COMPOSITION, PHOTOSENSITIVE ELEMENT, METHOD FOR FORMING RESIST PATTERN, AND METHOD FOR PRODUCING PRINTED WIRING BOARD

CROSS-REFERENCE TO RELATED APPLICATIONS

This application is a U.S. national phase application filed under 35 U.S.C. § 371 of International Application No. PCT/JP2021/016811, filed Apr. 27, 2021, designating the United States, which claims priority from Japanese application No. 2020-134942, filed Aug. 7, 2020, which are incorporated herein by reference in their entireties.

TECHNICAL FIELD

The present invention relates to a photosensitive resin composition, a photosensitive element, a method for forming a resist pattern, and a method for producing a printed wiring board.

BACKGROUND ART

In the field of printed wiring board production, photosensitive elements (laminates) including a photosensitive resin composition, a support, and a layer formed using a photosensitive resin composition (hereinafter, referred to as "photosensitive layer") on the support have been widely used as resist materials used for an etching treatment, a plating treatment, or the like.

In the case of producing a printed wiring board using a photosensitive element, first, a photosensitive layer of a photosensitive element is laminated on a substrate for circuit formation. Next, a predetermined part of the photosensitive layer is irradiated with an active light ray to cure an exposed area. Thereafter, the support is peeled off to be removed, and an unexposed area of the photosensitive layer is removed with a developing solution, thereby forming a resist pattern on the substrate. Next, the substrate having the resist pattern formed is subjected to an etching treatment or a plating treatment using the resist pattern as a mask to form a circuit pattern on the substrate, and a cured area (resist pattern) of the photosensitive layer is finally peeled off from the substrate to be removed.

As an exposure method, the photosensitive layer is subjected to pattern exposure through a mask film or the like. In recent years, a projection exposure method in which the photosensitive layer is exposed to light by irradiation via a lens with an active light ray projecting a photomask image has been used. As a light source to be used in the projection exposure method, an ultrahigh pressure mercury lamp is used. Generally, an exposure apparatus using the i-line monochromatic light (365 nm) as an exposure wavelength is mostly used, but the exposure wavelengths of the h-line monochromatic light (405 nm) and the ihg mixed lines may be used in some cases.

The projection exposure method is an exposure method that can ensure high resolution and high alignment as compared to a contact exposure method. Therefore, much attention has been given to the projection exposure method in recent years in which circuit formation in printed wiring boards is required to be refined.

With densification of printed wiring boards in recent years, a demand has been increasing for a photosensitive resin composition excellent in resolution and adhesiveness. Particularly, in the production of package substrates, there is a demand for a photosensitive resin composition that can form a resist pattern with a line width/a space width of 10/10 (unit: μm) or less. For example, in Patent Literature 1, it is investigated that the resolution and the adhesiveness are improved by using a specific photopolymerizable compound.

CITATION LIST

Patent Literature

Patent Literature 1: JP 2013-195712 A

SUMMARY OF INVENTION

Technical Problem

However, in recent years, miniaturization of conductor patterns has been increasingly developed, and thus it is desired for a photosensitive resin composition to form a finer resist pattern with both the line width and the space width of 5 μm or less, and further, both the line width and the space width of 1 μm or less.

The present disclosure has been devised in view of the problems of the conventional arts described above, and an object thereof is to provide a photosensitive resin composition being excellent in resolution and adhesiveness and capable of forming a fine resist pattern, a photosensitive element using the same, a method for forming a resist pattern, and a method for producing a printed wiring board.

Solution to Problem

An aspect of the present disclosure relates to a photosensitive resin composition containing: a binder polymer including a structural unit derived from a (meth)acrylate compound having a dicyclopentanyl group; a photopolymerizable compound; a photopolymerization initiator; a sensitizer having an absorption at 340 to 430 nm; and an ultraviolet absorber, in which a molar absorption coefficient of the ultraviolet absorber for light at a wavelength of 365 nm is in a range of 500 to 50000 L/(mol·cm).

Another aspect of the present disclosure relates to a photosensitive element including: a support; and a photosensitive layer formed using the above-described photosensitive resin composition on the support.

Still another aspect of the present disclosure relates to a method for forming a resist pattern, the method including: a photosensitive layer formation step of laminating a photosensitive layer containing the above-described photosensitive resin composition or a photosensitive layer of the above-described photosensitive element on a substrate; an exposure step of irradiating a predetermined part of the photosensitive layer with an active light ray to form a photo-cured area; and a development step of removing an area other than the predetermined part of the photosensitive layer from the substrate.

Still another aspect of the present disclosure relates to a method for producing a printed wiring board, the method including a step of subjecting a substrate having a resist pattern formed by the above-described method for forming a resist pattern to an etching treatment or a plating treatment to form a conductor pattern.

Advantageous Effects of Invention

According to the present disclosure, it is possible to provide a photosensitive resin composition being excellent in resolution and adhesiveness and capable of forming a fine resist pattern, a photosensitive element using the same, a method for forming a resist pattern, and a method for producing a printed wiring board.

DESCRIPTION OF EMBODIMENTS

Hereinafter, embodiments for carrying out the present disclosure will be specifically described. However, the present disclosure is not limited to the following embodiments. In the present specification, the term "step" includes not only an independent step but also a step by which an intended action of the step is achieved, even though the step cannot be clearly distinguished from other steps. In the present specification, the term "layer" is meant to include a structure having a shape that is formed over the entire surface when observed in a plan view, as well as a structure having a shape that is formed in a portion. In the present specification, the term "(meth)acrylic acid" means at least one of "acrylic acid" and "methacrylic acid" corresponding thereto. The same applies to other analogous expressions such as (meth) acrylate.

In the present specification, a numerical range that has been indicated by use of "to" indicates the range that includes the numerical values which are described before and after "to", as the minimum value and the maximum value, respectively. In the numerical ranges that are described stepwise in the present specification, the upper limit value or the lower limit value of a numerical range of a certain stage may be substituted by the upper limit value or the lower limit value of a numerical range of another stage. Furthermore, in a numerical range described in the present specification, the upper limit value or the lower limit value of the numerical range may be substituted by a value disclosed in the Examples.

In the present specification, when reference is made to the amount of each component in a composition, in a case where a plurality of substances corresponding to each component exist in the composition, the amount of each component in the composition means the total amount of the plurality of substances that exist in the composition, unless otherwise specified.

[Photosensitive Resin Composition]

A photosensitive resin composition of the present embodiment contains a component (A): a binder polymer including a structural unit derived from a (meth)acrylate compound having a dicyclopentanyl group; a component (B): a photopolymerizable compound; a component (C): a photopolymerization initiator; a component (D): a sensitizer having an absorption at 340 to 430 nm; and a component (E): an ultraviolet absorber, in which a molar absorption coefficient of the component (E) for light at a wavelength of 365 nm is in a range of 500 to 50000 L/(mol·cm). By containing the components (A) to (E) described above as essential components, the photosensitive resin composition of the present embodiment is excellent in resolution and adhesiveness and can form a fine resist pattern. The above-described photosensitive resin composition may further contain a hydrogen donor or other components as necessary. Hereinafter, respective components used in the photosensitive resin composition of the present embodiment will be more specifically described.

(Component (A): Binder Polymer)

The photosensitive resin composition of the present embodiment can further enhance resolution and adhesiveness by using a binder polymer including a structural unit derived from a (meth)acrylate compound having a dicyclopentanyl group.

The component (A) can be produced, for example, by radical polymerization of a polymerizable monomer that includes a (meth)acrylate compound having a dicyclopentanyl group. From the viewpoint of improving the hydrophobicity of the binder polymer, as the (meth)acrylate compound having a dicyclopentanyl group, for example, a compound represented by Formula (1) below may be used.

[Chemical Formula 1]

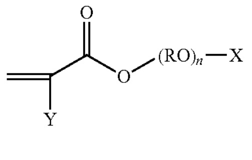

(1)

In Formula (1), Y represents a hydrogen atom or a methyl group, R represents an alkylene group having 1 to 4 carbon atoms, X represents a dicyclopentanyl group, and n represents an integer of 0 to 2.

Examples of the (meth)acrylate compound having a dicyclopentanyl group include dicyclopentanyl (meth)acrylate, dicyclopentanyloxyethyl (meth)acrylate, dicyclopentanyloxypropyl (meth)acrylate, and dicyclopentanyloxypropyloxyethyl (meth)acrylate. From the viewpoint of further enhancing the hydrophobicity of the binder polymer, dicyclopentanyl (meth)acrylate may be used.

From the viewpoint of further improving the resolution and adhesiveness of the photosensitive resin composition, the content of the structural unit derived from a (meth) acrylate compound having a dicyclopentanyl group (hereinafter, also referred to as "dicyclopentanyl-based structural unit") may be 1 to 50% by mass, 2 to 40% by mass, 3 to 30% by mass, or 3 to 25% by mass, and is preferably 4 to 20% by mass, more preferably 5 to 15% by mass, and further preferably 6 to 10% by mass, on the basis of the total mass (100% by mass) of structural units derived from polymerizable monomers constituting the binder polymer.

The component (A) may further include a structural unit derived from (meth)acrylic acid from the viewpoint of improving the alkali developability, and may further include a structural unit derived from styrene or a styrene derivative (hereinafter, also referred to as "styrene-based structural unit") from the viewpoint of improving the resolution and the adhesiveness and reducing the amount of occurrence of resist footing.

From the viewpoint of improving the hydrophobicity of the binder polymer, as the styrene or the styrene derivative, a compound represented by Formula (2) below may be used.

[Chemical Formula 2]

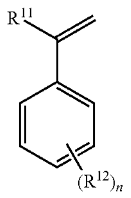

(2)

In Formula (2), RH represents a hydrogen atom or a methyl group, RI's each independently represent a hydrogen atom, an alkyl group, a (meth)acryloyl group, a phenyl group, or derivatives thereof, and n represents an integer of 1 to 5.

Examples of the styrene derivative include vinyl toluene, α-methylstyrene, p-methylstyrene, and p-ethylstyrene.

From the viewpoint of improving the resolution and the adhesiveness and reducing the amount of occurrence of resist footing, the content of the dicyclopentanyl-based structural unit and the styrene-based structural unit may be 50% by mass or more, 55% by mass or more, or 58% by mass or more, on the basis of the total mass of structural units derived from polymerizable monomers constituting the binder polymer. From the viewpoint that the developing time is moderately shortened and development residues are difficult to occur, the content of the dicyclopentanyl-based structural unit and the styrene-based structural unit may be 85% by mass or less, 80% by mass or less, or 75% by mass or less.

From the viewpoint of making the resolution, the adhesiveness, and the repressibility of occurrence of resist footing favorable, the content of the structural unit derived from (meth)acrylic acid may be 10 to 40% by mass, 15 to 35% by mass, or 20 to 30% by mass, on the basis of the total mass of structural units derived from polymerizable monomers constituting the binder polymer.

The component (A) may further include structural units derived from polymerizable monomers (hereinafter, also referred to as "other monomers") other than the above. Examples of the other monomers include benzyl (meth) acrylate or a derivative thereof, cycloalkyl (meth)acrylate, furfuryl (meth)acrylate, tetrahydrofurfuryl (meth)acrylate, isobornyl (meth)acrylate, adamantyl (meth)acrylate, dimethylaminoethyl (meth)acrylate, diethylaminoethyl (meth) acrylate, glycidyl (meth)acrylate, 2,2,2-trifluoroethyl (meth) acrylate, 2,2,3,3-tetrafluoropropyl (meth)acrylate, β-furyl (meth)acrylic acid, β-styryl (meth)acrylic acid, maleic acid, maleic anhydride, maleic acid monoalkyl ester, fumaric acid, cinnamic acid, α-cyanocinnamic acid, itaconic acid, crotonic acid, and propiolic acid. These can be used singly or in combination of two or more kinds thereof.

The weight average molecular weight (Mw) of the component (A) may be 8000 to 60000, 10000 to 50000, 15000 to 40000, 20000 to 35000, or 25000 to 30000. When the Mw is 60000 or less, there is a tendency that the resolution and the developability are improved, and when the Mw is 8000 or more, there is a tendency that the flexibility of a cured film is improved, so that chipping and peeling of the resist pattern are difficult to occur. The degree of dispersion (Mw/Mn) of the component (A) may be 1.0 to 3.0, 1.2 to 2.5, 1.4 to 2.3, or 1.5 to 2.0. When the degree of dispersion is decreased, there is a tendency that the resolution is improved. The weight average molecular weight of the binder polymer is measured by gel permeation chromatography (GPC) (calculated based on a calibration curve using standard polystyrene).

The acid value of the component (A) may be 100 to 250 mgKOH/g, 120 to 240 mgKOH/g, 140 to 230 mgKOH/g, or 150 to 230 mgKOH/g. When the acid value of the component (A) is 100 mgKOH/g or more, an increase in developing time can be sufficiently suppressed, and when the acid value of the component (A) is 250 mgKOH/g or less, the developing solution resistance (adhesiveness) of a cured product of the photosensitive resin composition is likely to be improved.

The acid value of the component (A) can be measured as follows. First, 1 g of the binder polymer for measurement of the acid value is precisely weighed out. 30 g of acetone is added to the precisely weighed binder polymer, and this resultant was homogeneously dissolved. Next, an appropriate amount of phenolphthalein as an indicator is added to this solution and then titration is performed using a 0.1 N potassium hydroxide (KOH) aqueous solution. The amount of KOH in milligram needed for neutralization of the acetone solution of the binder polymer for measurement is calculated to determine the acid value. In a case where a solution obtained by mixing the binder polymer with a synthetic solvent, a diluent solvent, or the like is used for measurement, the acid value is calculated by the following formula.

$$\text{Acid value}=0.1\times Vf\times 56.1/(Wp\times I/100)$$

In the formula, Vf represents the titer (mL) of the KOH aqueous solution, Wp represents the measured mass (g) of the solution containing the binder polymer, and I represents the measured proportion (% by mass) of nonvolatile components in the solution containing the binder polymer.

Note that, in a case where the binder polymer is blended in a state of being mixed with volatile components such as a synthetic solvent or a diluent solvent, the acid value can be measured after first heating for 1 to 4 hours at a temperature higher than the boiling point of the volatile components by 10° C. or higher in advance, before precise weighing, to remove the volatile components.

In the photosensitive resin composition of the present embodiment, the component (A) may be used as a single binder polymer alone or may be used as an arbitrary combination of two or more kinds of binder polymers. Examples of the binder polymer in the case of being used in combination of two or more kinds thereof include two or more kinds of binder polymers each including a different copolymerizing component (including those having different monomer units as copolymerizing components), two or more kinds of binder polymers each having a different Mw, and two or more kinds of binder polymers each having a different degree of dispersion.

The content of the component (A) in the photosensitive resin composition of the present embodiment may be 20 to 90% by mass, 30 to 80% by mass, or 40 to 65% by mass, on the basis of the total solid content of the photosensitive resin composition. When the content of the component (A) is 20% by mass or more, there is a tendency that the film moldability is excellent, and when the content of the component (A) is 90% by mass or less, there is a tendency that the sensitivity and the resolution are excellent.

(Component (B): Photopolymerizable Compound)

The component (B) is not particularly limited as long as it has at least one ethylenically unsaturated bond and is a photopolymerizable compound. From the viewpoint of improving the alkali developability, the resolution, and the peeling property after curing, the component (B) preferably includes at least one of bisphenol type (meth)acrylates, and more preferably includes a bisphenol A-type (meth)acrylate among the bisphenol type (meth)acrylates. Examples of the bisphenol A-type (meth)acrylate include 2,2-bis(4-((meth) acryloxypolyethoxy)phenyl)propane, 2,2-bis(4-((meth) acryloxypolypropoxy)phenyl)propane, 2,2-bis(4-((meth) acryloxypolybutoxy)phenyl)propane, and 2,2-bis(4-((meth) acryloxypolyethoxypolypropoxy)phenyl)propane. Of these, from the viewpoint of further improving the resolution and the peeling property, 2,2-bis(4-((meth)acryloxypolyethoxy) phenyl)propane is preferred.

Examples of commercially available products of the bisphenol A-type (meth)acrylate include BPE-200 (manufactured by SHIN-NAKAMURA CHEMICAL Co., Ltd., trade name) as 2,2-bis(4-((meth)acryloxydipropoxy)phenyl)propane and BPE-500 (manufactured by SHIN-NAKAMURA CHEMICAL Co., Ltd., trade name) and FA-321M (manufactured by Showa Denko Materials Co., Ltd. (former name: Hitachi Chemical Co., Ltd.), trade name) as 2,2-bis(4-(methacryloxypentaethoxy)phenyl)propane. Note that, the refractive index of BPE-200 is 1.512, and the refractive index of BPE-500 is 1.532. These bisphenol A-type (meth) acrylates may be used singly or in combination of two or more kinds thereof.

The content of the bisphenol type (meth)acrylate may be 40 to 98% by mass, 50 to 97% by mass, 60 to 95% by mass, or 70 to 90% by mass, on the basis of the total amount of the component (B). When this content is 40% by mass or more, the resolution, the adhesiveness, and the repressibility of occurrence of resist footing become more favorable, and when this content is 98% by mass or less, the developing time is moderately shortened and development residues are more difficult to occur.

From the viewpoint of improving the flexibility of a cured product (cured film), the component (B) other than the bisphenol type (meth)acrylate may further include at least one of polyalkylene glycol di(meth)acrylates having at least one of a (poly)oxyethylene chain and a (poly)oxypropylene chain in the molecule, and may further include a polyalkylene glycol di(meth)acrylate having both of a (poly) oxyethylene chain and a (poly)oxypropylene chain in the molecule. Examples of the polyalkylene glycol di(meth) acrylate include FA-023M (manufactured by Showa Denko Materials Co., Ltd., trade name), FA-024M (manufactured by Showa Denko Materials Co., Ltd., trade name), and NK ESTETR HEMA-9P (manufactured by SHIN-NAKAMURA CHEMICAL Co., Ltd., trade name). These may be used singly or in combination of two or more kinds thereof.

The content of the polyalkylene glycol di(meth)acrylate may be 2 to 40% by mass, 3 to 30% by mass, or 5 to 20% by mass, on the basis of the total amount of the component (B).

As the component (B) other than the above, a nonylphenoxypolyethylene oxyacrylate, a phthalic acid-based compound, a polyol (meth)acrylate ester, an alkyl (meth)acrylate ester, and the like may be used. Of these, from the viewpoint of improving the resolution, the adhesiveness, and the peeling property after resist formation and curing in a well-balanced manner, the component (B) may include at least one selected from a nonylphenoxypolyethylene oxyacrylate and a phthalic acid-based compound. However, since the refractive indices of these compounds are relatively low, from the viewpoint of improving the resolution, the content thereof may be 5 to 50% by mass, 5 to 40% by mass, or 10 to 30% by mass, on the basis of the total amount of the component (B).

Examples of the nonylphenoxypolyethylene oxyacrylate include nonylphenoxytriethylene oxyacrylate, nonylphenoxytetraethylene oxyacrylate, nonylphenoxypentaethylene oxyacrylate, nonylphenoxyhexaethylene oxyacrylate, nonylphenoxyheptaethylene oxyacrylate, nonylphenoxyoctaethylene oxyacrylate, nonylphenoxynonaethylene oxyacrylate, nonylphenoxydecaethylene oxyacrylate, and nonylphenoxyundecaethylene oxyacrylate.

Examples of the phthalic acid-based compound include γ-chloro-β-hydroxypropyl-β'-(meth)acryloyloxyethyl-o-phthalate, β-hydroxyethyl-β'-(meth)acryloyloxyethyl-o-phthalate, and β-hydroxypropyl-β'-(meth)acryloyloxyethyl-o-phthalate, and among these, the phthalic acid-based compound may be γ-chloro-β-hydroxypropyl-r-(meth)acryloyloxyethyl-o-phthalate. The γ-chloro-β-hydroxypropyl-β-methacryloyloxyethyl-o-phthalate is commercially available as FA-MECH (manufactured by Showa Denko Materials Co., Ltd., trade name).

From the viewpoint of improving the sensitivity and reducing footing trailing, the component (B) may include a polyol (meth)acrylate ester. Examples of the polyol (meth) acrylate ester include trimethylolpropane polyethoxy tri (meth)acrylate, trimethylolpropane polypropoxy tri(meth) acrylate, trimethylolpropane polybutoxy tri(meth)acrylate, trimethylolpropane polyethoxy polypropoxy tri(meth)acrylate, trimethylolethane polyethoxy tri(meth)acrylate, trimethylolethane polypropoxy tri(meth)acrylate, trimethylolethane polybutoxy tri(meth)acrylate, trimethylolethane polyethoxy polypropoxy tri(meth)acrylate, pentaerythritol polyethoxy tri(meth)acrylate, pentaerythritol polypropoxy tri(meth)acrylate, pentaerythritol polybutoxy tri(meth)acrylate, pentaerythritol polyethoxy polypropoxy tri(meth)acrylate, glyceryl polyethoxy tri(meth)acrylate, glyceryl polypropoxy tri(meth)acrylate, glyceryl polybutoxy tri(meth) acrylate, and glyceryl polyethoxy polypropoxy tri(meth) acrylate.

The content of the component (B) is set to preferably 20 to 60 parts by mass, more preferably 30 to 55 parts by mass, and further preferably 35 to 50 parts by mass, with respect to 100 parts by mass of the total amount of the component (A) and the component (B). When the content of the component (B) is in this range, the photosensitivity and the film coatability become more favorable in addition to the resolution, the adhesiveness, and the resist footing occurrence of the photosensitive resin composition.

(Component (C): Photopolymerization Initiator)

The component (C) is not particularly limited, and from the viewpoint of improving the sensitivity and the resolution in a well-balanced manner, a hexaarylbiimidazole derivative or an acridine compound having one or more acridinyl groups may be used. Particularly, in a case where the photosensitive layer is exposed using an active light ray at 390 nm to 420 nm, from the viewpoint of the sensitivity and the adhesiveness, the component (C) may include an acridine compound having one or more acridinyl groups.

Examples of the hexaarylbiimidazole derivative include 2-(o-chlorophenyl)-4,5-diphenylbiimidazole, 2,2',5-tris-(o-chlorophenyl)-4-(3,4-dimethoxyphenyl)-4',5'-diphenylbiimidazole, 2,4-bis-(o-chlorophenyl)-5-(3,4-dimethoxyphenyl)-diphenylbiimidazole, 2,4,5-tris-(o-chlorophenyl)-diphenylbiimidazole, 2-(o-chlorophenyl)-bis-4,5-(3,4-dimethoxyphenyl)-biimidazole, 2,2'-bis-(2-fluorophenyl)-4,4',5,5'-tetrakis-(3-methoxyphenyl)-biimidazole, 2,2'-bis-(2,3-difluoromethylphenyl)-4,4',5,5'-tetrakis-(3-methoxyphenyl)-biimidazole, 2,2'-bis-(2,4-difluorophenyl)-4,4',5,5'-tetrakis-(3-methoxyphenyl)-biimidazole, and 2,2'-bis-(2,5-difluorophenyl)-4,4',5,5'-tetrakis-(3-methoxyphenyl)-biimidazole. Of these, from the viewpoint of the sensitivity and the resolution, a 2-(o-chlorophenyl)-4,5-diphenylimidazole dimer is preferred. As the 2-(o-chlorophenyl)-4,5-diphenylimidazole dimer, 2,2'-bis(2-chlorophenyl)-4,4',5,5'-tetraphenyl-1,2-biimidazole is commercially available as trade name "B-CIM" manufactured by Hodogaya Chemical Co., Ltd.

Examples of the acridine compound include acridine compounds having one acridinyl group such as 9-phenylacridine, 9-(p-methylphenyl)acridine, 9-(m-methylphenyl) acridine, 9-(P-chlorophenyl)acridine, 9-(m-chlorophenypacridine, 9-aminoacridine, 9-dimethylaminoacridine, 9-diethylaminoacridine, and 9-pentylaminoacridine; and acridine compounds having two acridinyl groups such as 1,2-bis(9-acridinyl)ethane, 1,4-bis(9-acridinyl)butane, 1,6-bis(9-acridinyl)hexane, 1,8-bis(9-acridinyl)octane, 1,10-bis(9-acridinyl)decane, 1,12-bis(9-acridinyl)dodecane, 1,14-bis(9-acridinyl)tetradecane, 1,16-bis(9-acridinyl)hexadecane, 1,18-bis(9-acridinyl)octadecane, 1,20-bis(9-acridinyl)eicosane, 1,3-bis(9-acridinyl)-2-oxapropane, 1,3-bis(9-acridinyl)-2-thiapropane, and 1,5-bis(9-acridinyl)-3-thiapentane. These are used singly or in combination of two or more kinds thereof.

Examples of the other photopolymerization initiators include benzophenones such as 4,4'-bis(diethylamino)benzophenone; aromatic ketones such as 2-benzyl-2-dimethylamino-1-(4-morpholinophenyl)-butanone-1,2-methyl-1-[4-(methylthio)phenyl]-2-morpholino-propanone-1; quinones such as alkylanthraquinone; benzoinether compounds such as benzoinalkyl ethers; benzoin compounds such as benzoin and alkylbenzoin; benzyl derivatives such as benzyldimethylketal, N-phenylglycine, and N-phenylglycine derivatives; acylphosphine oxide-based photopolymerization initiators such as 2,4,6-trimethylbenzoyl-diphenyl-phosphine oxide and bis(2,4,6-trimethylbenzoyl)-phenylphosphine oxide; oxime ester compounds such as 1,2-octanedione,1-[4-(phenylthio)phenyl-,2-(O-benzoyloxime)] and ethanone,1-[9-ethyl-6-(2-methylbenzoyl)-9H-carbazol-3-yl]-,1-(O-acetyloxime). These may be mixed with a hexaarylbiimidazole derivative or an acridine compound and then used.

The content of the component (C) may be 0.5 to 10 parts by mass, 1 to 8 parts by mass, or 1.5 to 5 parts by mass, with respect to 100 parts by mass of the total amount of the component (A) and the component (B). When the content of the component (C) is in this range, both the photosensitivity and the resolution are easily improved in a well-balanced manner.

(Component (D): Sensitizer)

When the photosensitive resin composition of the present embodiment contains a sensitizer having an absorption at 340 to 430 nm as a component (D), the photosensitivity of the photosensitive resin composition can be improved. Examples of the sensitizer include a dialkylaminobenzophenone compound, a pyrazoline compound, an anthracene compound, a coumarin compound, a xanthone compound, a stilbene compound, and a triarylamine compound. From the viewpoint of the sensitivity and the adhesiveness, the sensitizer may include at least one selected from the group consisting of a pyrazoline compound, an anthracene compound, a coumarin compound, and a triarylamine compound, and may include at least one selected from the group consisting of a pyrazoline compound, an anthracene compound, and a coumarin compound.

Examples of the pyrazoline compound include 1-phenyl-3-(4-methoxystyryl)-5-(4-methoxyphenyl)pyrazoline, 1-phenyl-3-(4-tert-butylstyryl)-5-(4-tert-butylphenyl)pyrazoline, and 1-phenyl-3-biphenyl-5-(4-tert-butylphenyl)pyrazoline. Examples of the anthracene compound include 9,10-dibutoxyanthracene and 9,10-diphenylanthracene. Examples of the coumarin compound include 3-benzoyl-7-diethylaminocoumarin, 7-diethylamino-4-methylcoumarin, 3,3'-carbonylbis(7-diethylaminocoumarin), and 2,3,6,7-tetrahydro-9-methyl-1H,5H,11H-[1]benzopyrano[6,7,8-ij]quinolizin-11-one.

The content of the component (D) may be 0.005 to 1% by mass, 0.008 to 0.8% by mass, or 0.01 to 0.5% by mass, on the basis of the total solid content of the photosensitive resin composition. When the content of the component (D) is 0.01% by mass or more, the sensitivity and the resolution are further improved, and when the content of the component (D) is 10% by mass or less, the resist shape is suppressed from being an inverted trapezoid, and the adhesiveness is further improved. From the viewpoint of balance between the resolution and the adhesiveness, the content of the component (D) may be 0.005 to 0.5 parts by mass, 0.008 to 0.2 parts by mass, or 0.01 to 0.1 parts by mass, with respect to 100 parts by mass of the total amount of the component (A) and the component (B).

(Component (E): Ultraviolet Absorber)

When the photosensitive resin composition of the present embodiment contains an ultraviolet absorber as a component (E), a fine resist pattern excellent in resolution can be formed. A photosensitive layer having a thickness of 10 lam or less has low absorbance at an exposure wavelength and is likely to be affected by halation of the substrate surface, and during exposure for a resist pattern with a line width/space width of 5/5 lam or less, the reaction proceeds even in an unexposed area due to light undergoing halation, so that the solubility of the unexposed area in the developing solution is likely to be degraded. As a method of increasing the absorbance of the photosensitive layer at an exposure wavelength, it is conceivable to increase the content of the component (D); however, since the radical generation amount at the initial stage of the reaction during exposure increases, the polymerization degree of the component (B) is decreased so that the adhesiveness of the exposed area is likely to decrease. On the other hand, in a photosensitive layer formed from a photosensitive resin composition containing the component (E), by increasing the absorbance at an exposure wavelength to suppress halation on the substrate surface, a significant difference in solubility between the exposed area and the unexposed area is generated so that high resolution can be expressed, and the adhesiveness of the photo-cured area can be improved.

The component (E) may be a compound that absorbs light in a range of 340 to 430 nm, and may be a compound that effectively absorbs light at a wavelength of 365 nm. The molar absorption coefficient of the component (E) for light at a wavelength of 365 nm is in a range of 500 to 50000 L/(mol·cm). The molar absorption coefficient is an index for ease of light absorption. The molar absorption coefficient of the ultraviolet absorber can be measured, for example, by the following procedure.

First, acetonitrile solutions of ultraviolet absorbers having four or more different concentrations (mol/L) are prepared at room temperature (25° C.; the same applies hereinafter) using a volumetric flask and a whole pipette, respectively. As a dilution solvent, as necessary, methanol may be used. The concentration (mol/L) can be calculated by dividing the mass (g) of the ultraviolet absorber put in the volumetric flask by the molecular weight (g/mol) of the ultraviolet absorber and further dividing the obtained value by the volume (L) of the volumetric flask. Examples of the method of measuring the molecular weight (g/mol) of the ultraviolet absorber include mass spectrometry. The prepared acetonitrile solution of the ultraviolet absorber is filled in a quartz cell having an optical path length of 1 cm, and an absorption spectrum of the ultraviolet absorber is measured using an ultraviolet-visible spectrophotometer (for example, Hitachi High-Technologies Corporation, trade name: Hitachi Spectrophotometer U-3310). The spectrophotometer is used after the light source is stabilized, background measurement is then performed by a 1-cm quartz cell filled with acetonitrile, and the spectrophotometer is used for the absorption spectrum measurement of the ultraviolet absorber. As measurement conditions, the temperature is set to a temperature at the time of solution preparation, the slit width is set to 2 nm, the scan speed is set to 300 nm/min, the sampling interval is set to 0.50 nm, and the measurement range is set to 600 nm to 300 nm. It is checked that the absorbance at a wavelength of 365 nm does not exceed 2.0 in each measurement. An approximation straight line is drawn by a least-square method, in which the vertical axis represents the absorbance of the ultraviolet absorber for light at a wavelength of 365 nm and the horizontal axis represents the product of the concentration of the ultraviolet absorber and the optical path length. It is checked that the determination coefficient is 0.999 or more. The inclination of the obtained straight line is calculated by the Lambert-Beer's Law as the molar absorption coefficient (L/(mol·cm)) at a wavelength of 365 nm. Note that, in a case where the absorbance at 365 nm measured when the sample concentration is $1\times10^{-4}$ mol/L is 0.01 or less, the molar absorption coefficient is defined to be 100 or less.

From the viewpoint of effectively absorbing light at an exposure wavelength, the molar absorption coefficient of the component (E) for light at 365 nm is 500 to 50000 L/(mol·cm), and may be 800 to 30000 L/(mol·cm), 1000 to 20000 L/(mol·cm), or 1100 to 15000 L/(mol·cm).

In the case of exposing the photosensitive layer using an active light ray at 340 to 430 nm, since the component (E) effectively absorbs light at an exposure wavelength, the ultraviolet absorber may include at least one selected from the group consisting of a benzophenone compound, a benzotriazole compound, and a triazine compound, and may include a benzophenone compound. The benzophenone compound may be a benzophenone compound in which some of hydrogen atoms are substituted with a group having an oxygen atom, and may be a benzophenone compound having a hydroxy group.

Examples of the benzophenone compound include 4,4'-dimethoxybenzophenone, 4,4'-bis(trimethylacetoxy)benzophenone, 2,4,4'-trihydroxybenzophenone, 2,2',4,4'-tetrahydroxybenzophenone, 2,3,4,4'-tetrahydroxybenzophenone, 2,2',3,4,4'-pentahydroxybenzophenone, 2,4-dihydroxybenzophenone, 2-hydroxy-4-methoxybenzophenone, 2,2'-dihydroxy-4-methoxybenzophenone, 2-hydroxy-4-(octyloxy) benzophenone, and 2-hydroxy-4-methoxy-benzophenone-5-sulfonic acid. Examples of the benzotriazole compound include 2,2-methylenebis[6-(2H-benzotriazole-2-yl)-4-tert-octylphenol], 2-(2'-hydroxy-5'-methacryloyloxyethylphenyl)-2H-benzotriazole, 2-(2H-benzotriazole-2-yl)-4,6-di-tert-pentylphenol, and 2-(5-chloro-2H-benzotriazole-2-yl)-6-tert-butyl-4-methylphenol. Examples of the triazine compound include 2-[4,6-di(2,4-xylyl)-1,3,5-triazin-2-yl]-5-octyloxyphenol and 2,4,6-tris(2-hydroxy-4-hexyloxy-3-methylphenyl)-1,3,5-triazine.

The content of the component (E) may be 0.05 to 5.0 parts by mass, 0.1 to 4.0 parts by mass, or 0.2 to 2.0 parts by mass, with respect to 100 parts by mass of the total amount of the component (A) and the component (B). When the content of the component (E) is in this range, both the resolution and the adhesiveness are easily improved in a well-balanced manner.

From the viewpoint of further improving the resolution and adhesiveness of the photosensitive resin composition, the ratio of absorbance derived from the component (E) at an exposure wavelength may be 30 to 90%, 40 to 90%, or 45 to 85%, on the basis of the absorbance of the photosensitive layer at an exposure wavelength. When the ratio of absorbance derived from the component (E) is 30% or more, it is easy to suppress the influence of halation of the substrate surface, and when the ratio of absorbance derived from the component (E) is 90% or less, the adhesiveness of the resist pattern with respect to the substrate is easy to be further improved.

(Hydrogen Donor)

The photosensitive resin composition of the present embodiment may further contain a hydrogen donor. Thereby, the sensitivity of the photosensitive resin composition becomes further favorable. Examples of the hydrogen donor include bis[4-(dimethylamino)phenyl]methane, bis[4-(diethylamino)phenyl]methane, N-phenylglycine, and leuco crystal violet. These are used singly or in combination of two or more kinds thereof.

In a case where the photosensitive resin composition contains the hydrogen donor, the content thereof may be 0.01 to 10% by mass, 0.05 to 5% by mass, or 0.1 to 2% by mass, on the basis of the total solid content of the photosensitive resin composition. When the content of the hydrogen donor is 0.01% by mass or more, the sensitivity can be further improved, and when the content of the hydrogen donor is 10% by mass or less, an excessive hydrogen donor is suppressed from being precipitated as a foreign matter after the film formation.

(Other Components)

The photosensitive resin composition can further contain other components as necessary. Examples of the other components include a photopolymerizable compound (such as an oxetane compound) having at least one cation polymerizable cyclic ether group in the molecule thereof, a cation polymerization initiator, a dye (such as malachite green), tribromophenylsulfone, a photochromic agent, a thermal development inhibitor, a plasticizer (such as p-toluenesulfonamide), a polymerization inhibitor (such as tert-butylcatechol), a silane coupling agent, a pigment, a filler, an antifoaming agent, a flame retardant, a stabilizing agent, a tackifier, a leveling agent, a release promoter, an antioxidant, perfume, an imaging agent, and a thermal crosslinking agent. These are used singly or in combination of two or more kinds thereof. The content of each of the other components may be about 0.01 to 20% by mass.

In order to improve the handleability of the photosensitive resin composition or adjust the viscosity and the storage stability, the photosensitive resin composition can contain at least one kind of organic solvents. As the organic solvent, an organic solvent to be generally used can be used without particular limitation. Examples of the organic solvent include methanol, ethanol, acetone, methyl ethyl ketone, methyl cellosolve, ethyl cellosolve, toluene, N,N-dimethylformamide, propylene glycol monomethyl ether, and mixed solvents thereof. For example, the component (A), the component (B), and the component (C) are dissolved in an organic solvent and then the resultant solution can be used as a solution (hereinafter, referred to as "coating liquid") having a solid content of about 30 to 60% by mass. Note that, the solid content means a remaining component obtained by removing a volatile component from the solution of the photosensitive resin composition.

[Photosensitive Element]

A photosensitive element of the present embodiment includes: a support; and a photosensitive layer containing the above-described photosensitive resin composition formed on the support. In the case of using the photosensitive element of the present embodiment, the photosensitive layer may be laminated on a substrate and then may be exposed without the support being peeled off.

(Support)

As the support, a polymer film (support film) having heat resistance and solvent resistance, which is formed from a polyester such as polyethylene terephthalate (PET), or a polyolefin such as polypropylene or polyethylene, can be used. Particularly, from the viewpoint of ease of availability and excellent handleability (particularly, heat resistance, heat shrinkage rate, or rupture strength) in the production process, the support may be a PET film.

The haze of the support may be 0.01 to 1.0% or 0.01 to 0.5%. When the haze of the support is 0.01% or more, there is a tendency that the support itself is easily produced, and when the haze of the support is 1.0% or less, there is a tendency that microdefects, which may occur in a resist pattern, are reduced. Herein, the term "haze" means the degree of haze. The haze in the present disclosure refers to a value measured using a commercially available cloudiness meter (turbidimeter) according to the method defined in JIS K 7105. The haze can be measured, for example, using a commercially available turbidimeter such as NDH-5000 (manufactured by NIPPON DENSHOKU INDUSTRIES CO., LTD.).

Particles with a diameter of 5 μm or more, and the like included in the support may be present at $5/mm^2$ or less, and the support may be a support containing particles. Thereby, the slidability of the support surface is improved, and at the same time, a satisfactory balance to inhibit light scattering during exposure can be created and the resolution and the adhesiveness can be improved. The average particle diameter of particles may be 5 μm or less, 1 μm or less, or 0.1 μm or less. Note that, the lower limit value of the average particle diameter is not particularly limited, and may be 0.001 μm or more.

Examples of commercially available products as such a support include "QS48" (Toray Industries, Inc.), "FB40" (Toray Industries, Inc.), "QS69" (Toray Industries, Inc.), "R705G" (Mitsubishi Chemical Corporation), and "HTF-01" (Teijin Film Solutions Limited) which are a three-layer structure biaxially oriented PET film containing particles on an outermost layer, and "A-1517" (TOYOBO CO., LTD.) which is a two-layer structure biaxially oriented PET film having a layer containing particles on one surface.

The thickness of the support may be 1 to 100 μm, 5 to 50 μm, or 5 to 30 μm. When the thickness is 1 μm or more, the support can be suppressed from being torn when the support is peeled off, and when the thickness is 100 μm or less, a reduction in resolution can be suppressed.

(Intermediate Layer)

The photosensitive element may further include an intermediate layer between the support and the photosensitive layer. The intermediate layer may be a layer containing a water-soluble resin. Examples of the water-soluble resin include a resin including polyvinyl alcohol as a main component.

(Protective Layer)

The photosensitive element may further include a protective layer as necessary. As the protective layer, a film in which the adhesive force between the photosensitive layer and the protective layer is smaller than the adhesive force between the photosensitive layer and the support may be used, and a film with low fisheye may be used. Specifically, as a protective film, for example, a polymer film that can be used as the support described above is mentioned. In view of the releasability from the photosensitive layer, the protective film may be a polyethylene film. The thickness of the protective layer varies depending on use application, but may be about 1 to 100 μm.

[Method for Producing Photosensitive Element]

The photosensitive element can be produced, for example, as follows. The photosensitive element can be produced by a production method including: preparing the above-described coating liquid; applying the coating liquid onto a support to form a coating layer; and drying the coating layer to form a photosensitive layer. The applying of the coating liquid on the support can be performed, for example, by known methods such as roll coating, comma coating, gravure coating, air knife coating, die coating, and bar coating.

The drying of the coating layer is not particularly limited as long as at least a part of an organic solvent can be removed from the coating layer. The drying may be performed, for example, at 70 to 150° C. for about 5 to 30 minutes. After the drying, the amount of the organic solvent remaining in the photosensitive layer may be 2% by mass or less from the viewpoint of preventing the diffusion of the organic solvent in the subsequent step.

The thickness of the photosensitive layer in the photosensitive element can be appropriately selected depending on use application, and the thickness after drying may be 1 to 100 μm, 1 to 50 μm, 1 to 40 μm, or 3 to 20 μm. When the thickness of the photosensitive layer is 1 μm or more, industrial coating is facilitated so that the productivity is improved, and when the thickness of the photosensitive layer is 100 μm or less, the adhesiveness and the resolution are further improved.

The photosensitive element can be suitably used, for example, in a method for forming a resist pattern described below. Particularly, from the viewpoint of the resolution, the photosensitive element is suitable for application to a method for producing a conductor pattern by a plating treatment.

[Method for Forming Resist Pattern]

A method for forming a resist pattern of the present embodiment includes: a photosensitive layer formation step of laminating a photosensitive layer containing the above-described photosensitive resin composition or a photosensitive layer of the above-described photosensitive element on a substrate; an exposure step of irradiating a predetermined part of the photosensitive layer with an active light ray to form a photo-cured area; and a development step of removing an area other than the predetermined part of the photosensitive layer from the substrate. The method for forming a resist pattern may include other steps as necessary. Note that, the resist pattern can be said to be a photo-cured product pattern or a relief pattern of the photosensitive resin composition. Furthermore, the method for forming a resist pattern can be said to be a method for producing a substrate with a resist pattern.

(Photosensitive Layer Formation Step)

As a method for forming the photosensitive layer on a substrate, for example, the photosensitive resin composition may be applied and dried, or the photosensitive layer may be pressure-bonded on the substrate while the photosensitive layer of the photosensitive element is heated after the protective layer is removed from the photosensitive element. In the case of using the photosensitive element, a laminate including the substrate, the photosensitive layer, and the support, which are laminated in this order, is obtained. The substrate is not particularly limited, and a substrate for circuit formation including an insulation layer and a conductor layer formed on the insulation layer, a metal base material for metal mask production, a die pad (a base material for lead frame) such as an alloy base material, or the like is used.

The surface roughness (Ra) of the substrate may be 10 to 200 nm, 30 to 100 nm, or 40 to 100 nm, from the viewpoint of further improving the resolution. When the Ra is 40 to 100 nm, halation due to irregularities on the substrate surface can be suppressed, so that the resolution is further improved.

In the case of using the photosensitive element, in view of the adhesiveness and the followability, the photosensitive layer formation step is preferably performed under reduced pressure. The heating of the photosensitive layer and/or the substrate during the pressure bonding may be performed at a temperature of 70 to 130° C. The pressure bonding may be performed at a pressure of about 0.1 to 1.0 MPa (about 1 to 10 kgf/cm$^2$), but these conditions are appropriately selected as necessary. Note that, when the photosensitive layer is heated to 70 to 130° C., there is no need to preheat the substrate in advance, but the substrate can also be preheated in order to further improve the adhesiveness and the followability.

(Exposure Step)

In the exposure step, at least a part of the photosensitive layer formed on the substrate is irradiated with an active light ray, thereby photo-curing an area irradiated with the active light ray to form a latent image. At this time, in a case where the support present on the photosensitive layer is transparent to the active light ray, the photosensitive layer can be irradiated with the active light ray through the support, whereas in a case where the support blocks the active light ray, the photosensitive layer is irradiated with the active light ray after the support is removed.

Examples of the exposure method include a method of performing imagewise irradiation with an active light ray via a negative or positive mask pattern called artwork (mask exposure method). Furthermore, a method of irradiating an image with an active light ray by a projection exposure method may be adopted.

Known light sources can be used as a light source for the active light ray, and for example, a carbon arc lamp, a mercury vapor arc lamp, a high-pressure mercury lamp, an ultrahigh pressure mercury lamp, a xenon lamp, a gas laser such as an argon laser, a solid-state laser such as a YAG laser, and a semiconductor laser, which efficiently emit ultraviolet rays or visible light, are used. The wavelength of the active light ray may be within a range of 340 nm to 430 nm.

(Development Step)

In the development step, at least a part of the photosensitive layer other than the photo-cured area is removed from the substrate, so that a resist pattern is formed on the substrate. In a case where the support is present on the photosensitive layer, after the support is removed, an area (also called an unexposed area) other than the photo-cured area is removed (developed). The development method includes wet development and dry development, and wet development is widely used.

In the case of the wet development, development is performed by a known development method using a developing solution corresponding to the photosensitive resin composition. Examples of the development method include methods using dipping, paddling, spraying, brushing, slapping, scrubbing, shaking immersion, and the like, and from the viewpoint of improving the resolution, a high-pressure spraying method may be used. Two or more kinds of these methods may be combined for the development.

The configuration of the developing solution is appropriately selected depending on the configuration of the photosensitive resin composition. For example, an alkaline aqueous solution and an organic solvent developing solution are mentioned.

In view of being safe and stable and having good handleability, an alkaline aqueous solution may be used as the developing solution. Examples of the base of the alkaline aqueous solution to be used include alkali hydroxides such as hydroxides of lithium, sodium, or potassium; alkaline carbonates such as carbonates or bicarbonates of lithium, sodium, potassium, or ammonium; alkali metal phosphates such as potassium phosphate and sodium phosphate; alkali metal pyrophosphates such as sodium pyrophosphate and potassium pyrophosphate; borax, sodium metasilicate, tetramethylammonium hydroxide, ethanolamine, ethylenediamine, diethylene triamine, 2-amino-2-hydroxymethyl-1,3-propanediol, 1,3-diaminopropanol-2, and morpholine.

As the alkaline aqueous solution to be used for development, a 0.1 to 5% by mass dilute solution of sodium carbonate, a 0.1 to 5% by mass dilute solution of potassium carbonate, a 0.1 to 5% by mass dilute solution of sodium hydroxide, a 0.1 to 5% by mass dilute solution of sodium tetraborate, or the like can be used. The pH of the alkaline aqueous solution to be used for development may be set in a range of 9 to 11, and the temperature thereof can be adjusted according to the alkali developability of the photosensitive layer.

Into the alkaline aqueous solution, for example, a surfactant, an antifoaming agent, a small amount of an organic solvent for promoting development, or the like may be incorporated. Note that, examples of the organic solvent used for the alkaline aqueous solution include acetone, ethyl acetate, alkoxyethanol having an alkoxy group having 1 to 4 carbon atoms, ethyl alcohol, isopropyl alcohol, butyl alcohol, diethylene glycol monomethyl ether, diethylene glycol monoethyl ether, and diethylene glycol monobutyl ether.

Examples of the organic solvent used for the organic solvent developing solution include 1,1,1-trichloroethane, N-methylpyrrolidone, N,N-dimethylformamide, cyclohexanone, methyl isobutyl ketone, and y-butyrolactone. It may be possible that water is added to these organic solvents within a range of 1 to 20% by mass for anti-flammability to prepare the organic solvent developing solution.

The method for forming a resist pattern in the present embodiment may include a step of further curing the resist pattern by heating at about 60 to 250° C. or exposing at about 0.2 to 10 J/cm$^2$, as necessary, after the uncured area is removed in the development step.

[Method for Producing Printed Wiring Board]

A method for producing a printed wiring board of the present embodiment includes a step of subjecting a substrate having a resist pattern formed by the above-described method for forming a resist pattern to a plating treatment or an etching treatment to form a conductor pattern. The method for producing a printed wiring board may include other steps such as a resist pattern removing step, as necessary.

In the plating treatment, the resist pattern formed on the substrate is used as a mask, and a conductor layer provided on the substrate is subjected to the plating treatment. After the plating treatment, a conductor pattern may be formed by removing the resist by the removal of the resist pattern described below and further etching the conductor layer covered by the resist.

The plating treatment method may be either an electrolytic plating treatment or an electroless plating treatment, but may be an electrolytic plating treatment. Examples of the electrolytic plating treatment include copper plating, solder plating, nickel plating, and gold plating. In the etching treatment, the resist pattern formed on the substrate is used as a mask, and the conductor layer formed on the substrate is removed by etching to form a conductor pattern. The etching treatment method is appropriately selected depending on the conductor layer to be removed. Examples of an etching solution include a cupric chloride solution, a ferric chloride solution, an alkali etching solution, and a hydrogen peroxide-based etching solution.

After the etching treatment or the plating treatment, the resist pattern on the substrate may be removed. The resist pattern can be removed by being peeled off, for example, with an aqueous solution of stronger alkalinity than the alkaline aqueous solution used in the development step. As this strong alkaline aqueous solution, for example, a 1 to 10% by mass sodium hydroxide aqueous solution, a 1 to 10% by mass potassium hydroxide aqueous solution, and the like are used.

In a case where the resist pattern is removed after the plating treatment, a desired printed wiring board can be produced by further subjecting the conductor layer covered by the resist to the etching treatment to form a conductor pattern. The etching treatment method at this time is appropriately selected depending on the conductor layer to be removed. For example, the above-described etching solution can be applied.

The method for producing a printed wiring board according to the present embodiment can be applied not only to production of single-layer printed wiring boards but also to production of multilayer printed wiring boards, and can also be applied to production of printed wiring boards having small diameter through-holes, and the like.

EXAMPLES

Hereinafter, the present disclosure will be more specifically described by means of Examples; however, the present disclosure is not limited to these Examples. Note that, unless otherwise specified, the units "part(s)" and "%" are mass basis.

(Binder Polymer (A-1))

162 g of methacrylic acid, 395 g of styrene, 44 g of dicyclopentanyl methacrylate, and 6 g of azobisisobutyronitrile, which are polymerizable monomers (monomers), were mixed to prepare a solution a. Furthermore, 11 g of 1-methoxy-2-propanol and 17 g of toluene (mass ratio of 2:3) were mixed to prepare a solution b. Further, 0.6 g of azobisisobutyronitrile was mixed with a mixed liquid of 11 g of 1-methoxy-2-propanol and 17 g of toluene (mass ratio of 2:3) to prepare a solution c.

Into a flask equipped with a stirrer, a reflux condenser, a thermometer, a dropping funnel, and a nitrogen gas inlet tube, a mixed liquid of 323 g of 1-methoxy-2-propanol and 484 g of toluene (mass ratio of 2:3)) was charged. Next, heating was performed while stirring and blowing nitrogen gas into the flask, raising the temperature to 80° C.

The solution a was added dropwise to the mixed liquid in the flask over 4 hours, and then the solution b was added dropwise over 10 minutes. Thereafter, the resultant solution was stirred at 80° C. for 2 hours. Next, the solution c was added dropwise to the solution in the flask over 10 minutes, and then stirred at 80° C. for 2 hours. Further, while continuing stirring, the solution in the flask was heated to 95° C. over 30 minutes. Next, the solution c was newly added dropwise thereto over 10 minutes, and then stirred at 95° C. for 3 hours. Next, stirring was stopped, and the resultant solution was cooled to room temperature to obtain a solution of a binder polymer (A-1). Note that, in the present specification, the room temperature means 25° C.

The Mw of the binder polymer (A-1) was 27900. The Mw was measured by gel permeation chromatography (GPC) and was derived by conversion using a calibration curve of standard polystyrene. The calibration curve was approximated by the cubic formula of the universal calibration curve using five sets of standard polystyrene samples (PStQuick MP-H, PStQuick B [manufactured by Tosoh Corporation, trade name]) according to JIS K 7252-2 (2016). GPC conditions are shown below.

(GPC Conditions)

Column: Gelpack GL-R440, Gelpack GL-R450, and Gelpack GL-R400M (all manufactured by Showa Denko Materials Co., Ltd.) are connected Eluent: Tetrahydrofuran Measurement temperature: 40° C.

Flow rate: 2.05 mL/min

Concentration: 5 mg/mL

Injection amount: 200 μL

Detector: Hitachi L-2490 type RI (manufactured by Hitachi, Ltd.)

(Binder Polymer (A-2))

A solution of a binder polymer (A-2) was obtained in the same manner as in preparation of the solution of the binder polymer (A-1), except that methacrylic acid, methyl methacrylate, styrene, and benzyl methacrylate were used as polymerizable monomers at mass ratios shown in Table 1.

As for the binder polymers (A-1) and (A-2), the mass ratio (%) of the polymerizable monomers and the Mw are shown in Table 1.

TABLE 1

| | | A-1 | A-2 |
|---|---|---|---|
| Monomer (mass ratio) | Methacrylic acid | 27 | 27 |
| | Methyl methacrylate | — | 5 |
| | Styrene | 65.7 | 45 |
| | Benzyl methacrylate | — | 23 |
| | Dicyclopentanyl methacrylate | 7.3 | — |
| Mw | | 27900 | 44000 |
| Mw/Mn | | 1.8 | 2.3 |

Examples 1 to 3 and Comparative Example 1

<Preparation of Photosensitive Resin Composition>

Photosensitive resin compositions of Examples and Comparative Example were prepared, respectively, by mixing the binder polymer (A-1) or (A-2) with the (B) photopolymerizable compound, the (C) photopolymerization initiator, the (D) sensitizer, the (E) ultraviolet absorber, other components, and a solvent at blending amounts (parts by mass) shown in Table 2 below. Note that, the blending amount of the binder polymer shown in Table 2 is the mass (solid content) of the nonvolatile components.

((B) Photopolymerizable Compound)

B-1: 2,2-Bis(4-(methacryloxypentaethoxy)phenyl)propane (manufactured by Showa Denko Materials Co., Ltd., trade name: FA-321M)

B-2: Ethoxylated bisphenol A dimethacrylate (EO average 4 mol-modified) (manufactured by SHIN-NAKAMURA CHEMICAL Co., Ltd., trade name: BPE-200)

B-3: (PO)(EO)(PO)-modified polyethylene glycol dimethacrylate (EO average 6-mol and PO average 12-mol modified) (manufactured by Showa Denko Materials Co., Ltd., trade name: FA-024M)

((C) Photopolymerization Initiator)

C-1: 2,2'-Bis(2-chlorophenyl)-4,4',5,5'-tetraphenyl-1,2-biimidazole (manufactured by Hodogaya Chemical Co., Ltd., trade name: B-CIM)

((D) Sensitizer)

D-1: 1-Phenyl-3-(4-methoxystyryl)-5-(4-methoxyphenyl) pyrazoline (manufactured by NIPPON CHEMICAL INDUSTRIAL CO., LTD., molar absorption coefficient (365 nm): 34400 L/(mol·cm))

((E) Ultraviolet Absorber)

E-1: 2,2',4,4'-Tetrahydroxybenzophenone (manufactured by SHIPRO KASEI KAISHA, LTD., molar absorption coefficient (365 nm): 10878 L/(mol·cm))

E-2: 2-Hydroxy-4-(octyloxy)benzophenone (manufactured by Chemipro Kasei Kaisha, Ltd., molar absorption coefficient (365 nm): 1220 L/(mol·cm))

((F) Other Components)

F-1: Leuco crystal violet (manufactured by Yamada Chemical Co., Ltd.)

F-2: Malachite green (manufactured by OSAKA ORGANIC CHEMICAL INDUSTRY LTD.)

F-3: tert-Butylcatechol (manufactured by FUJIFILM Wako Pure Chemical Corporation)

F-4: Benzotriazole derivative (manufactured by SANWA KASEI CORP., trade name: SF-808H, molar absorption coefficient (365 nm): 100 L/(mol·cm) or less)

F-5: 3-Mercaptopropyltrimethoxysilane (manufactured by Shin-Etsu Chemical Co., Ltd.)

<Production of Photosensitive Element>

The solution of the photosensitive resin composition was uniformly applied onto a polyethylene terephthalate film (manufactured by Toray Industries, Inc., trade name "QS69") having a thickness of 16 μm, dried for 10 minutes by a hot air convection drier set at 90° C., and then protected by a polyethylene film (manufactured by TAMAPOLY CO., LTD., trade name "NF-15A"), thereby obtaining a laminate (photosensitive element) in which the support, the photosensitive layer, and the protective film are laminated. The thickness of the photosensitive layer after drying was 6 μm.

<Measurement of Absorbance>

The photosensitive element was laminated on a surface of slide glass (manufactured by Matsunami Glass Ind., Ltd., white slide glass excise No. 1 S1126). The lamination was performed using a heat roll set at 110° C. with a bonding pressure of 0.2 MPa and a roll speed of 1.0 m/min such that the photosensitive layer of the photosensitive element was in contact with the slide glass surface, while the protective layer was peeled off. The photosensitive layer is laminated on the slide glass, and then the support was peeled off. The absorbance of the photosensitive layer was measured using U-3310 type spectrophotometer (manufactured by Hitachi High-Tech Science Corporation, measurement conditions including wavelength range: 330 to 700 nm, scan speed: 300 nm/min, scan interval: 0.50 nm). Baseline measurement was performed using unprocessed slide glass as a reference and a sample. The absorbance ($A_{total}$) at an exposure wavelength (365 nm) was recorded from the obtained measured spectrum and regarded as the absorbance of the photosensitive layer. The absorbance of Comparative Example 1 not containing an ultraviolet absorber was regarded as an absorbance ($A_D$) derived from the photopolymerization initiator and the sensitizer, and an absorbance ($A_E$) derived from the ultraviolet absorber was set as a value obtained by subtracting $A_D$ from $A_{total}$.

<Production of Laminate>

A substrate (Ra: 40 nm) having a copper layer was pickled, rinsed, and then dried with an air stream. Thereafter, the substrate was heated to 80° C., and the photosensitive element was laminated on the copper surface of the substrate. The lamination was performed using a heat roll set at 110° C. with a bonding pressure of 0.4 MPa and a roll speed of 1.0 m/min such that the photosensitive layer of the photosensitive element was in contact with the copper surface of the substrate, while the protective layer was peeled off. In this way, a laminate in which the substrate, the photosensitive layer, and the support are laminated in this order was obtained. The obtained laminate was used as a test specimen for a test described below.

<Evaluation of Resolution and Adhesiveness>

On the support of the test specimen, a glass chromium-type phototool (negative for resolution: one having a wiring pattern with a line width/space width of x/x (x: 1 to 10, unit: μm), negative for adhesiveness: one having a wiring pattern with a line width/space width of x/x (x: 1 to 18, unit: μm)) was used as a negative for evaluation of resolution and adhesiveness, and the photosensitive layer was exposed at a predetermined energy dose by using a projection exposure apparatus (manufactured by Ushio Inc., trade name "UX-44101SM") equipped with an ultrahigh pressure mercury lamp (365 nm) as a light source. After exposure, the support was peeled off to expose the photosensitive layer, and a 1% by mass sodium carbonate aqueous solution set at 27° C. was sprayed for a time three times the minimum developing time (the minimum time for removing the unexposed area) to remove the unexposed area (development treatment).

After the development treatment, the resolution and the adhesiveness were evaluated by the minimum value of the line width/space width among values of the line width/space width for resist patterns formed with cleanly removed space areas (unexposed areas), and without twists, meandering, and chipping of the line areas (exposed areas). At this time, values of the line width/space width evaluated based on the exposure dose in which the resist line width with a line width/space width=2/2 μm of the adhesiveness negative pattern is 2.0 μm were recorded as the resolution and the adhesiveness. A smaller numerical value indicates more satisfactory resolution and adhesiveness.

<Evaluation of Resist Shape>

For a pattern with a line width/space width=2/2 μm among resist patterns after the development treatment, the line widths of the upper part (x) and the bottom part (y) of the resist were measured using a scanning electron microscope (SEM, SU-8010, manufactured by Hitachi High-Technologies Corporation), acceleration voltage: 5.0 kV). A taper ratio (x/y) was determined from the measured values as an evaluation criterion of the resist shape. As the taper ratio is close to 1, the resist shape is close to a rectangle, which can be said to be favorable. The resist shape having a taper ratio of 0.9 or more and less than 1.1 was evaluated as "A", the resist shape having a taper ratio of 1.1 or more and less than 1.3 was evaluated as "B", and the resist shape having a taper ratio of 1.3 or more was evaluated as "C".

TABLE 2

| | | Example 1 | Example 2 | Example 3 | Comparative Example 1 | Comparative Example 2 |
|---|---|---|---|---|---|---|
| (A) | A-1 | 57 | 57 | 57 | — | 57 |
| | A-2 | — | — | — | 57 | — |
| (B) | B-1 | 30.5 | 30.5 | 30.5 | 30.5 | 30.5 |
| | B-2 | 10 | 10 | 10 | 10 | 10 |
| | B-3 | 2.5 | 2.5 | 2.5 | 2.5 | 2.5 |
| (C) | C-1 | 2.9 | 2.9 | 2.9 | 2.9 | 2.5 |
| (D) | D-1 | 0.02 | 0.02 | 0.02 | 0.02 | 0.10 |
| (E) | E-1 | 0.254 | 0.6 | — | — | — |
| | E-2 | — | — | 1 | — | — |
| (F) | F-1 | 0.5 | 0.5 | 0.5 | 0.5 | 0.6 |
| | F-2 | 0.05 | 0.05 | 0.05 | 0.05 | 0.03 |
| | F-3 | 0.05 | 0.05 | 0.05 | 0.05 | 0.055 |
| | F-4 | 1 | 1 | 1 | 1 | 1.5 |
| | F-5 | 0.5 | 0.5 | 0.5 | 0.5 | 0.25 |
| Absorbance $A_{total}$ (365 nm) | | 0.148 | 0.347 | 0.075 | 0.04 | 0.071 |
| Absorbance $A_D$ | | 0.040 | 0.040 | 0.040 | 0.040 | 0.071 |
| Absorbance $A_E$ | | 0.108 | 0.307 | 0.035 | 0 | 0 |
| $A_E/A_{total}$ (%) | | 73.0 | 88.5 | 46.7 | 0 | 0 |
| Resolution (μm) | | 2.3 | 2.2 | 2.3 | 2.9 | 2.5 |
| Adhesiveness (μm) | | 1.8 | 1.8 | 1.9 | 2.3 | 2.4 |
| Resist shape | | A | B | A | A | B |

From Table 2, it can be confirmed that the photosensitive resin compositions of Examples 1 to 3 are excellent in resolution and adhesiveness as compared to Comparative Examples 1 and 2 and can form fine resist patterns.

The invention claimed is:

1. A photosensitive resin composition comprising:

a binder polymer including a structural unit derived from a (meth)acrylate compound having a dicyclopentanyl group, wherein a content of the structural unit derived from a (meth)acrylate compound having a dicyclopentanyl group is 6 to 10% by mass on the basis of the total mass of structural units derived from polymerizable monomers constituting the binder polymer, and a weight average molecular weight of the binder polymer is 25000 to 30000;

a photopolymerizable compound;

a photopolymerization initiator;

a sensitizer having an absorption at 340 to 430 nm; and an ultraviolet absorber comprising a benzophenone compound having a hydroxy group, wherein a content of the ultraviolet absorber is 0.2 to 2.0 parts by mass, with respect to 100 parts by mass of the total amount of the binder polymer and the photopolymerizable compound, and a molar absorption coefficient of the ultraviolet absorber for light at a wavelength of 365 nm is in a range of 500 to 50000 L/(mol·cm).

2. The photosensitive resin composition according to claim 1, wherein the photopolymerizable compound includes a bisphenol A-type (meth)acrylate.

3. The photosensitive resin composition according to claim 2, wherein the bisphenol A-type (meth)acrylate includes 2,2-bis(4-((meth)acryloxypolyethoxy)phenyl) propane.

4. The photosensitive resin composition according to claim 2, wherein the bisphenol A-type (meth)acrylate includes 2,2-bis(4-((meth)acryloxydipropoxy)phenyl) propane.

5. The photosensitive resin composition according to claim 2, wherein the bisphenol A-type (meth)acrylate includes 2,2-bis(4-(methacryloxypentaethoxy)phenyl) propane.

6. The photosensitive resin composition according to claim 1, wherein the photopolymerizable compound includes polyalkylene glycol di(meth)acrylate.

7. The photosensitive resin composition according to claim 1, wherein the binder polymer further includes a structural unit derived from styrene or a styrene derivative.

8. The photosensitive resin composition according to claim 7, wherein a content of the structural unit derived from a (meth)acrylate compound having a dicyclopentanyl group and the structural unit derived from styrene or a styrene derivative is 50% by mass or more on the basis of the total mass of structural units derived from polymerizable monomers constituting the binder polymer.

9. The photosensitive resin composition according to claim 1, wherein the ultraviolet absorber comprises at least one compound selected from the group consisting of 2,4,4'-trihydroxybenzophenone, 2,2',4,4'-tetrahydroxybenzophenone, 2,3,4,4'-tetrahydroxybenzophenone, 2,2',3,4,4'-pentahydroxybenzophenone, 2,4-dihydroxybenzophenone, 2-hydroxy-4-methoxybenzophenone, 2,2'-dihydroxy-4-methoxybenzophenone, 2-hydroxy-4-(octyloxy)benzophenone, and 2-hydroxy-4-methoxy-benzophenone-5-sulfonic acid.

10. A photosensitive element comprising: a support; and a photosensitive layer containing a photosensitive resin composition formed on the support, wherein the photosensitive resin composition comprises:

a binder polymer including a structural unit derived from a (meth)acrylate compound having a dicyclopentanyl group, wherein a content of the structural unit derived from a (meth)acrylate compound having a dicyclopentanyl group is 6 to 10% by mass on the basis of the total mass of structural units derived from polymerizable monomers constituting the binder polymer, and a weight average molecular weight of the binder polymer is 25000 to 30000;

a photopolymerizable compound;

a photopolymerization initiator;

a sensitizer having an absorption at 340 to 430 nm; and an ultraviolet absorber comprising a benzophenone compound having a hydroxy group, wherein a content of the ultraviolet absorber is 0.2 to 2.0 parts by mass, with respect to 100 parts by mass of the total amount of the binder polymer and the photopolymerizable compound, and a molar absorption coefficient of the ultraviolet absorber for light at a wavelength of 365 nm is in a range of 500 to 50000 L/(mol·cm).

11. The photosensitive element according to claim 10, wherein the ultraviolet absorber comprises at least one compound selected from the group consisting of 2,4,4'-trihydroxybenzophenone, 2,2',4,4'-tetrahydroxybenzophenone, 2,3,4,4'-tetrahydroxybenzophenone, 2,2',3,4,4'-pentahydroxybenzophenone, 2,4-dihydroxybenzophenone, 2-hydroxy-4-methoxybenzophenone, 2,2'-dihydroxy-4-methoxybenzophenone, 2-hydroxy-4-(octyloxy)benzophenone, and 2-hydroxy-4-methoxy-benzophenone-5-sulfonic acid.

12. A method for forming a resist pattern, the method comprising:

a photosensitive layer formation step of laminating a photosensitive layer containing a photosensitive resin composition on a substrate, wherein the photosensitive resin composition comprises:

a binder polymer including a structural unit derived from a (meth)acrylate compound having a dicyclopentanyl group, wherein a content of the structural unit derived from a (meth)acrylate compound having a dicyclopentanyl group is 6 to 10% by mass on the basis of the total mass of structural units derived from polymerizable monomers constituting the binder polymer, and a weight average molecular weight of the binder polymer is 25000 to 30000;

a photopolymerizable compound;

a photopolymerization initiator;

a sensitizer having an absorption at 340 to 430 nm; and an ultraviolet absorber comprising a benzophenone compound having a hydroxy group, wherein a content of the ultraviolet absorber is 0.2 to 2.0 parts by mass, with respect to 100 parts by mass of the total amount of the binder polymer and the photopolymerizable compound, and a molar absorption coefficient of the ultraviolet absorber for light at a wavelength of 365 nm is in a range of 500 to 50000 L/(mol·cm);

an exposure step of irradiating a predetermined part of the photosensitive layer with an active light ray to form a photo-cured area; and a development step of removing an area other than the predetermined part of the photosensitive layer from the substrate.

13. The method for forming a resist pattern according to claim 12, wherein a wavelength of the active light ray is within a range of 340 nm to 430 nm.

14. The method for forming a resist pattern according to claim 12, wherein the ultraviolet absorber comprises at least one compound selected from the group consisting of 2,4,4'-trihydroxybenzophenone, 2,2',4,4'-tetrahydroxybenzophenone, 2,3,4,4'-tetrahydroxybenzophenone, 2,2',3,4,4'-pentahydroxybenzophenone, 2,4-dihydroxybenzophenone, 2-hydroxy-4-methoxybenzophenone, 2,2'-dihydroxy-4-methoxybenzophenone, 2-hydroxy-4-(octyloxy)benzophenone, and 2-hydroxy-4-methoxy-benzophenone-5-sulfonic acid.

15. A method for producing a printed wiring board, the method comprising a step of subjecting a substrate having a resist pattern formed by the method for forming a resist pattern according to claim 12 to an etching treatment or a plating treatment to form a conductor pattern.

16. A method for forming a resist pattern, the method comprising:

a photosensitive layer formation step of laminating a photosensitive layer of the photosensitive element according to claim 10 on a substrate;

an exposure step of irradiating a predetermined part of the photosensitive layer with an active light ray to form a photo-cured area; and a development step of removing an area other than the predetermined part of the photosensitive layer from the substrate.

17. The method for forming a resist pattern according to claim 16, wherein a wavelength of the active light ray is within a range of 340 nm to 430 nm.

18. A method for producing a printed wiring board, the method comprising a step of subjecting a substrate having a resist pattern formed by the method for forming a resist pattern according to claim 16 to an etching treatment or a plating treatment to form a conductor pattern.

* * * * *